United States Patent
Shetty et al.

(10) Patent No.: US 12,068,052 B2
(45) Date of Patent: Aug. 20, 2024

(54) PRESERVING BLOCKS EXPERIENCING PROGRAM FAILURE IN MEMORY DEVICES

(71) Applicant: Micron Technology, Inc., Boise, ID (US)

(72) Inventors: Pranam Shetty, Udupi (IN); Arunkumar B, Bangalore (IN); Haritima Swapnil, Bangalore (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/682,064

(22) Filed: Feb. 28, 2022

(65) Prior Publication Data

US 2023/0197186 A1 Jun. 22, 2023

(30) Foreign Application Priority Data

Dec. 21, 2021 (IN) .............................. 202141059628

(51) Int. Cl.
| | |
|---|---|
| *G11C 29/00* | (2006.01) |
| *G11C 16/10* | (2006.01) |
| *G11C 16/26* | (2006.01) |
| *G11C 29/42* | (2006.01) |
| *G11C 29/12* | (2006.01) |

(52) U.S. Cl.
CPC .......... *G11C 29/789* (2013.01); *G11C 16/102* (2013.01); *G11C 16/26* (2013.01); *G11C 29/42* (2013.01); *G11C 29/76* (2013.01); *G11C 2029/1202* (2013.01)

(58) Field of Classification Search
CPC ..... G11C 29/789; G11C 16/102; G11C 16/26; G11C 29/42; G11C 29/76; G11C 2029/1202

See application file for complete search history.

(56) References Cited

U.S. PATENT DOCUMENTS

| | | | | |
|---|---|---|---|---|
| 7,509,526 | B2 * | 3/2009 | Hodder | G06F 12/0246 714/6.13 |
| 9,158,622 | B2 * | 10/2015 | Lee | G11C 29/808 |
| 9,570,177 | B2 * | 2/2017 | Choi | G11C 29/4401 |
| 10,672,497 | B2 * | 6/2020 | Cai | G06F 3/0619 |

* cited by examiner

*Primary Examiner* — Vanthu T Nguyen
(74) *Attorney, Agent, or Firm* — Lowenstein Sandler LLP

(57) ABSTRACT

A system and method for preserving block experiencing wordline failure in memory devices. An example method includes performing, by a processor, a write operation to program data to a set of memory cells addressable by a first wordline of a plurality of wordlines of a block of a memory device; determining that a program fault occurred during the write operation; determining a number of wordlines referenced by a program fault data structure that are associated with the block; and responsive to determining that the number of wordlines fails to satisfy a threshold criterion, releasing a second wordline of the plurality of wordlines to be available for write operations.

20 Claims, 8 Drawing Sheets

PROGRAM FAULT DATA STRUCTURE
410

| Block ID Number | Entry Number | PF Wordline ID |
|---|---|---|
| Block 13 | 1 | 5 |
| Block 42 | 1 | 22 |
| Block 13 | 2 | 40 |
| Block 13 | 3 | 49 |
| Block 2 | 1 | 7 |
| Block 42 | 2 | 30 |
| ... | ... | ... |
| ... | ... | ... |
| ... | ... | ... |
| ... | ... | ... |
| n | m | b |

FIG. 4

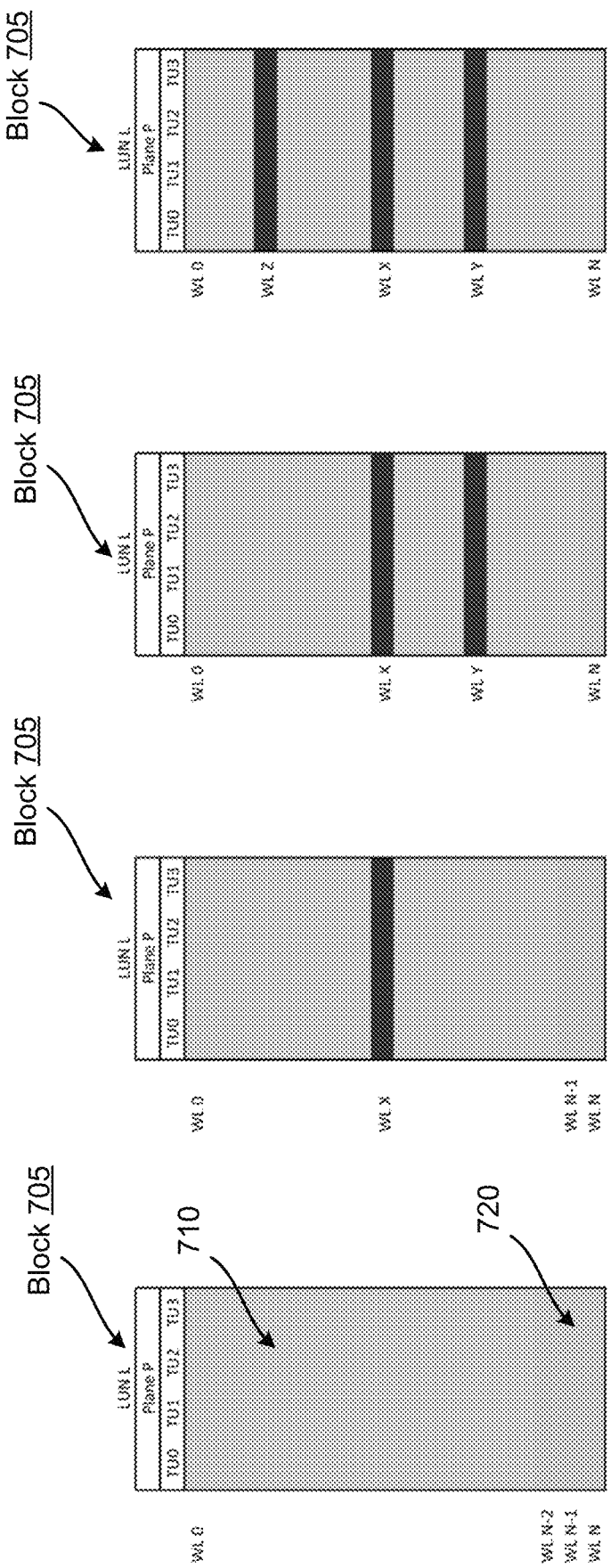

PRESERVING BLOCKS EXPERIENCING PROGRAM FAILURE IN MEMORY DEVICES

RELATED APPLICATION

This application claims the benefit of Indian Provisional Application No. 202141059628, filed Dec. 21, 2021, the entire content of which is hereby incorporated by reference.

TECHNICAL FIELD

Embodiments of the disclosure relate generally to memory sub-systems, and more specifically, relate to preserving block experiencing wordline failure in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 is an illustrative example of a program fault data structure, in accordance with some embodiments of the present disclosure.

FIGS. 7A-7D are illustrative diagrams showing an example block experiencing exchanging an defective wordline for a spare wordline, in accordance with some embodiments of the present disclosure.

DETAILED DESCRIPTION

Figure 1:
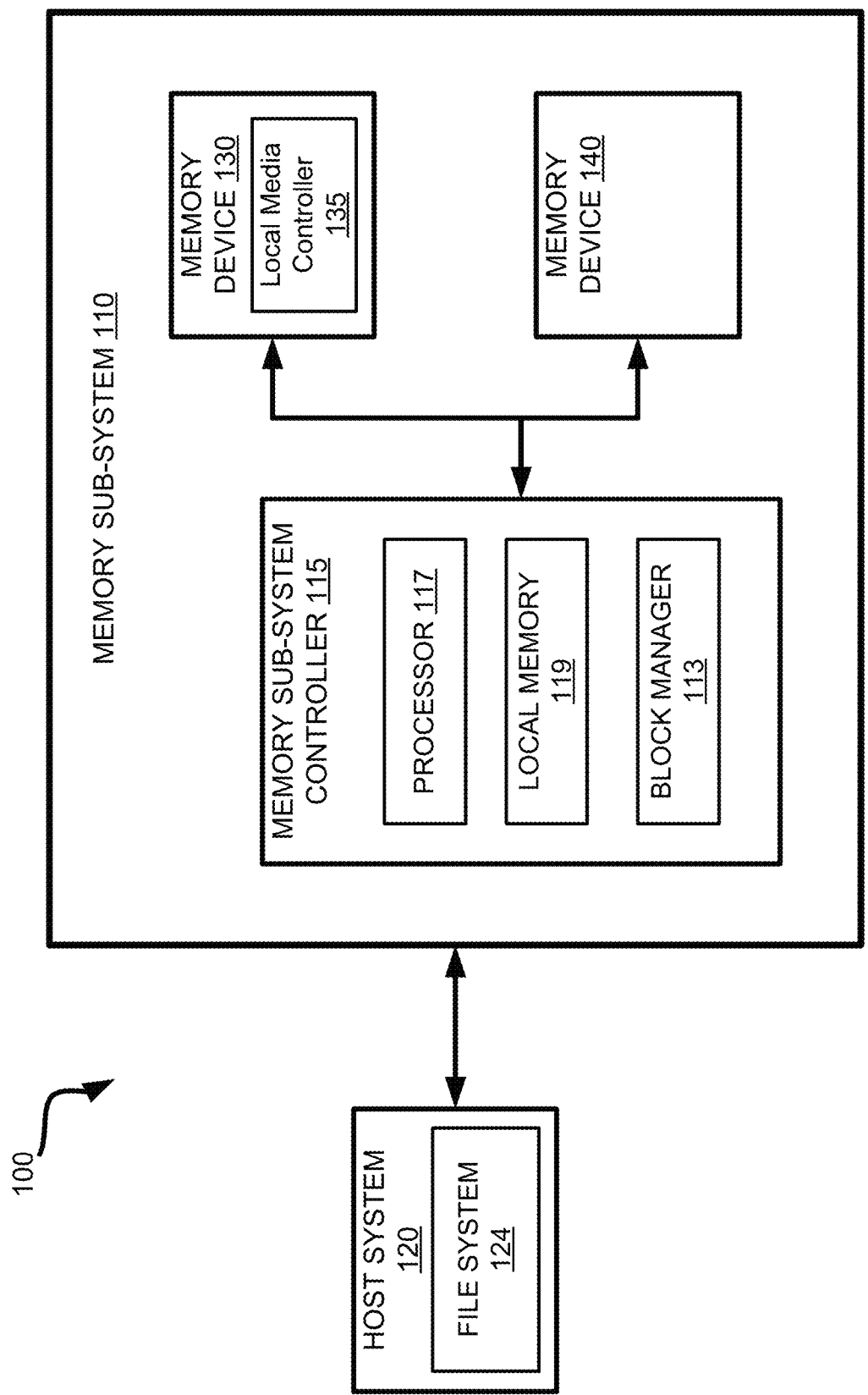
FIG. 1 illustrates an example computing system that includes a host system and a memory sub-system, in accordance with some embodiments of the present disclosure.

Aspects of the present disclosure are directed to preserving application data order in memory devices. The memory sub-system can be a storage device, a memory module, or a combination of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

The memory sub-system and memory devices can store data from the host system in storage media, e.g., integrated circuit (IC) dies having addressable memory cells that individually store the data. Some memory sub-systems can randomly allocate portions of data to the memory devices and in small increments of data, e.g., four kilobytes (KB). These random allocations of a page or a block of data can cause non-sequential and/or random writes to the memory devices. This practice can result in high costs in memory, e.g., dynamic random access memory (DRAM), static random access memory (SRAM), or persistent memory, for storing mapping data structures that track logical-to-physical (LTP) address mapping between logical block address (LBA) space and physical address space of the IC dies. For example, mapping overhead is about a gigabyte (GB) per terabyte (TB) of host addressable media, and thus, a 16 TB solid-state drive (SSD) requires a significant 16 GB of memory mapping overhead. Additionally, periodic snap-shotting and logging is done to persist the mapping data structures across shutdowns and surprise power failure situations. This can add additional write overhead to the IC dies and performance loss.

Storage stacks can take advantage of sequential input-output (IO) memory device efficiencies. For example, storage stacks included in file systems group data by locality (e.g., according to thread, process, or application) and write the data sequentially to storage devices. File systems can then write data to different localities as parallel sequential streams to storage devices, each stream being associated with its own locality. Locality can reference either temporal locality or spatial locality. Data having temporal locality is data that a processor tends to access repetitively over a short period of time, e.g., data written, over-written, and trimmed around the same time. Data having spatial locality captures when a memory device references a particular storage location at a particular time, then the memory device is likely to reference nearby memory locations in the near future. In this case, a processor can attempt to determine the size and shape of the area around the current reference for which it is worthwhile to prepare for faster access for subsequent reference. Reference to sequential locality is a special case of spatial locality that occurs when data elements are arranged and accessed linearly, such as in traversing the elements in a one-dimensional array.

When data items having locality are written sequentially, the data items are written to a group of memory cells that is referred to as a "zone", where each zone can store multiple physical blocks of data. Thus, the mapping of a particular data group as a zone in the LBA space can be recorded at a higher granularity (e.g., megabytes instead of kilobytes), which significantly reduces the size of the metadata. The mapping space associated with the LBA space can be referred to as zoned namespace (ZNS), and a memory device written in this manner referred to as a ZNS memory device. In one example, a data group is made up of multiple blocks of data having either temporal and/or spatial locality, where each data block corresponds to a physical block (e.g., erase unit) of the IC dies. In one embodiment, the physical block of a memory device can be around 16 megabytes (MB) in size. The groups of memory cells (or zones) can be at least two to four times (or more) the size of the physical block. Accordingly, the zones can store at least 64 MB of data (e.g., 64 MB, 128 MB, 256 MB, 512 MB, or more), each of which is significantly larger than four kilobytes (KB).

In certain host operating systems, a file system handles management of files and metadata utilized for organization of files and allocation of space in the memory devices necessary to write the files and metadata as they are generated. File systems of certain host operating systems such as Linux, Unix, and the like, allocate block groups (e.g., file system storage units) to a series of physical addresses at which the memory device would store the block group. The files can include file data, file metadata, directory structure, free space manager, and the like, and other data structures (or objects) capable of packaging data/metadata and being written to the memory device, which will be discussed in more detail. Some file metadata can be associated with the file (e.g., index nodes (inodes)). The file systems typically allocate certain types of block groups to a particular series of physical addresses of the memory device based on whether the block groups contain data or metadata, and try not to intermix the data and metadata within these particular series of physical addresses.

When data is written to a memory cell of the memory sub-system for storage, the memory cell can deteriorate. Accordingly, each memory cell of the memory sub-system can have a finite number of write operations performed on the memory cell before the memory cell is no longer able to reliably store data. Data stored at the memory cells of the memory sub-system can be read from the memory sub-system and transmitted to a host system. For example, during a read operation, a read reference voltage is applied to the wordline containing the data to be read, while a pass-through voltage is applied to wordlines of unread memory cells. The pass-through voltage is a read reference voltage higher than any of the stored threshold voltages. As such, when data is written to a memory cell of the memory sub-system for storage, the memory cell can also deteriorate.

Over time, as memory access operations (e.g., write operations, read operations, erase operations, etc.) are repeatedly performed on the blocks of the memory device, certain defects can develop. These defects can result in a program failure. A program failure occurs when a write operation failed to program host data to a wordline of a block. Responsive to a program failure occurring at a wordline, the memory sub-system controller can identify the corresponding block, and label said block as a "grown bad block" (GBB). A GBB refers to a block that is no longer reliable for storing or retrieving data, for example, due to a defect (e.g., manufacturing defect) or due to wear, and can be identified based on a threshold, e.g., bit error rates (BER) threshold. A GBB will not be used again for the lifespan of the memory sub-system.

To compensate for a lost block (block being labeled as a GGB), the memory sub-system may maintain a set of "spare blocks" to be used in place of the GBBs. A spare block is a block maintained in reserve to replace a GBB so that the capacity of the memory device does not decrease. Once a supply of space blocks is exhausted by a growing amount of GBBs, the memory device can reach its end of functional life.

In current systems, a block may include hundreds of wordlines. Accordingly, a single defective wordline can cause an entire block to be removed from use, thus removing, for example, hundreds of usable wordlines from use. Thus, mechanisms and methods for re-using blocks affected by program failure, without reducing block capacity, are desirable.

Aspects of the present disclosure address the above and other deficiencies through preserving blocks experiencing program failure in memory devices. In particular, each block can be manufactured with a predetermined set of wordlines (e.g., 100 wordlines per block). The wordlines of each block can be split into a set of available wordlines (e.g., 97 available wordlines) and a set of spare wordlines (e.g., 3 spare wordlines). That is, during a calibration process, each block can be configured to maintain a predetermined amount of spare wordlines that are reserved to replace available wordlines that become defective during the operational lifetime of the memory device. The sets of memory cells addressable by the spare wordlines can be initially made unavailable for write operations by, for example, the memory-subsystem controller excluding references to the spare wordlines from a free pool of available physical locations stored on the local memory of the memory sub-system. The free pool of available physical locations can be used by the memory sub-system controller to select memory cells for program operations.

When an available wordline in a block experiences a program failure, the memory sub-system controller can retire the available wordline (make unavailable for future memory access operations by listing the wordline in a program fault data structure). The memory sub-system controller can then activate a spare wordline associated with the same block (make available for memory access operations) by adding a reference to the spare wordline to the free pool of available physical locations. This allows the memory sub-system controller to select the spare wordline for future write operations. Accordingly, rather than labeling the block as a GBB, the memory sub-system controller can continue using the block without any loss of memory capacity. Furthermore, since the number of wordlines available for the block remains the same (e.g., the removed defected wordlines is replaced with a previously inactive spare wordline), the storage capacity of the block remains static.

Once the spare wordlines of a block are exhausted, for a subsequent program failure associated with the block, the memory sub-system controller can label the block as a GBB, thus effectively retiring the block from service. As such, each block can endure multiple program failures without experiencing loss of storage capacity.

Advantages of the present disclosure include but are not limited to increasing the service life and storage capacity of a memory device. In particular, by replacing defective wordlines with spare wordlines, the service life of each block is increased while the storage capacity remains unchanged. This allows a zone size also remained unchanged, thus not affecting any configurations associated with a ZNS. Furthermore, by increasing the service life of each block, the memory device can maintain fewer spare blocks to not only compensate for the lost memory capacity reserving spare wordlines, but also increase the overall memory capacity of the memory device. Other advantages will be apparent to those skilled in the art of memory access from memory devices discussed hereinafter.

FIG. 1 illustrates an example computing system 100 that includes a memory sub-system 110 and a host system 120 in accordance with some embodiments of the present disclosure. The memory sub-system 110 can include media, such as one or more non-volatile memory devices (e.g., memory device 130), one or more volatile memory devices (e.g., memory device 140), or a combination of such. Each memory device 130 or 140 can be one or more memory component(s).

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components or devices, which can be an indirect communicative connection or direct communicative connection (e.g., without intervening components or devices), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface, which can communicate over a system bus. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands from the host system 120 and can convert the commands into appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for memory management within the same memory device package. An example of a managed memory device is a managed NAND (MNAND) device.

The computing system 100 includes a file system 124 in the host system 120 that is configured with data organization functionality discussed herein throughout the Figures. In some embodiments, the host system 120 includes at least a portion of the file organization and storage allocation functionality. In other embodiments, or in combination, the controller 115 and/or a processing device of the host system 120 includes at least a portion of the file organization and storage allocation functionality. For example, the controller and the processing device (processor) of the host system 120 can be configured to execute instructions stored in memory for performing the operations of the file organization and storage allocation functionality described herein.

In one embodiment, the memory sub-system 110 includes a block manager 113 that can be used to manage blocks experiencing program failure in the memory device 130 and the memory device 140. In particular, the block management component 113 can identify defective wordlines and logically replace the defective wordlines with spare wordlines. In some embodiments, the memory sub-system controller 115 includes at least a portion of the block manager 113. In some embodiments, the block manager 113 is part of the host system 120, an application, or an operating system. In other embodiments, local media controller 135 includes at least a portion of block manager 113 and is configured to perform the functionality described herein.

In some embodiments, block manager 113 can maintain a set of spare wordlines for each block of memory device 130, 140. In particular, each block can be manufactured with a predetermined set of wordlines split into a set of available wordlines and a set of spare wordlines The spare wordlines can be reserved, by block manager 113, to replace available wordlines that become defective during the operational lifetime of memory device 130, 140. Block manager 113 can render the sets of memory cells addressable by the spare wordlines as unavailable for write operations by, for example, excluding references to the spare wordlines from a free pool of available physical locations. The free pool of available physical locations stored on local memory 119 of memory sub-system 110. The free pool of available physical locations can be used by the memory sub-system controller to select memory cells for program operations. The list of spare wordlines can be maintained in a spare wordline data structure, which is explained in greater detail in FIG. 5.

When an available wordline in a block experiences a program failure, block manager 113 can retire the available wordline (make unavailable for future memory access operations) and activate a spare wordline associated with the same block (make available for memory access operations). In some embodiments, block manager 113 can retire a wordline by listing the wordline in a program fault data structure, which is explained in greater detail in FIG. 4. Block manager 113 can activate a spare wordline by, for example, adding a reference to the spare wordline to the free pool of available physical locations. This allows the memory sub-system controller to select the spare wordline for future write operations. Further details with regards to the operations of the block manager 113 are described below.

Figure 2:
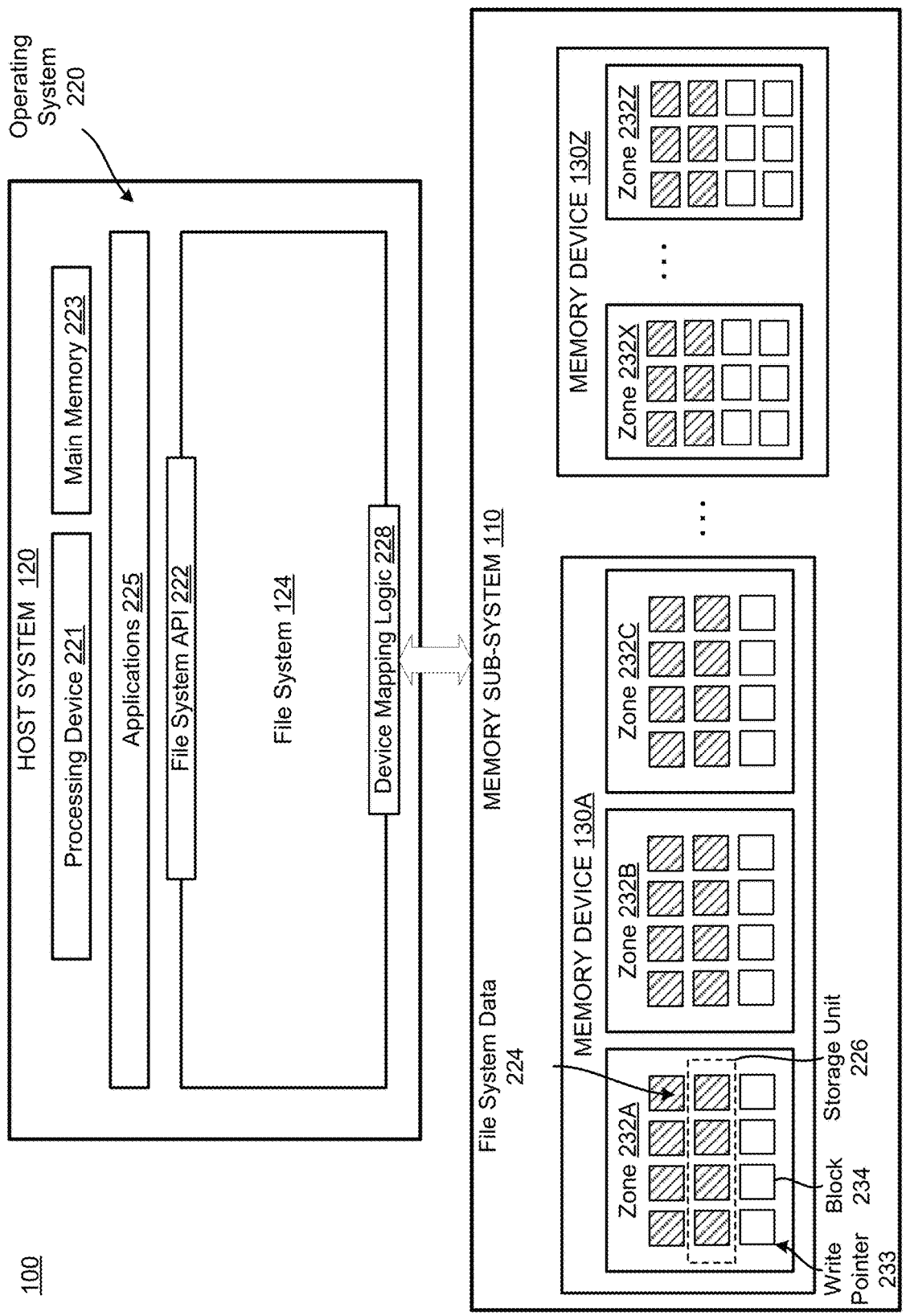
FIG. 2 is a detailed block diagram of the computing system of FIG. 1, in accordance with some embodiments of the present disclosure.

FIG. 2 is a detailed block diagram of the computing system 100 that includes a file system that uses the multiple zones of a memory sub-system to more efficiently store data. In the example shown, host system 120 includes a file system 124, one or more applications 225 and the memory sub-system 110 includes multiple zones 232A-Z that are spread across one or more memory devices 130A-Z.

File system 124 can manage the storage and retrieval of data from the memory sub-system 110. File system 124 can include data structures and rules used to organize the data and can involve separating the data into storage units that can be individually identified and accessed. File system 124 can be integrated into a kernel, a device driver, an application, other portion of operating system 220, or a combination thereof. File system 124 can execute as one or more system processes (e.g., kernel processes), user processes (e.g., application processes), or a combination thereof.

File system 124 can include multiple layers and the multiple layers can include a logical file system (e.g., logical layer), a virtual file system (e.g., virtual layer), a physical file system (e.g., physical layer), or other layer. The logical file system can manage interaction with applications 225 and can provide an application program interface (e.g., File System API 222) that exposes file system operations (e.g., open, close, create, delete, read, write, execute) to other computer programs. The logical layer of file system 124 can manage security and permissions and maintain open file table entries and per-process file descriptors. The logical file system can pass requested operations (e.g., write requests) to one or more other layers for processing. The virtual file system can enable operating system 220 to support multiple concurrent instances of physical file systems, each of which can be referred to as a file system implementation. The physical file system can manage the physical operation of the storage device (e.g. memory sub-system 110). The physical file system can handle buffering and manage main memory and can be responsible for the physical placement of storage units in specific locations on the memory devices 130A-Z. The physical file system can include device mapping logic 228 and can interact with device drivers or with the channel to interact with memory sub-system 110. One or more of the file system layers can be explicitly separated or can be combined together in order to store file system data 224.

File system data 224 can be any data associated with file system 124 and can include data received by file system 124 or data generated by file system 124. File system data 224 can represent data of one or more external file system objects, internal file system objects, or a combination thereof. The external file system objects can be file system objects that are externally accessible by a computer program (e.g., applications 225) using file system API 222. The external file system objects can include files (e.g., file data and metadata), directories (e.g., folders), links (e.g., soft links, hard links), or other objects. The internal file system objects can be file system objects that remain internal to the file system and are inaccessible using file system API 222. The internal file system objects can include storage tree objects (e.g., extent map, extent tree, block tree), stream objects (e.g., stream identifiers), file group data (e.g., group of similar files), storage units, block groups, extents, or other internal data structures.

Each file system object can include object data and can be associated with object metadata. The object data can be the content of the object (e.g., file data) and the object metadata can be information about the object (e.g., file metadata). The object metadata can indicate attributes of the object such as a storage location (e.g., zone, block group, storage unit), data source (e.g., stream, application, user), data type (e.g., text, image, audio, video), size (e.g., file size, directory size), time (e.g., creation time, modification time, access time), ownership (e.g., user ID, group ID), permissions (e.g., read, write, execute), file system location (e.g., parent directory, absolute path, local path), other attribute, or a combination thereof. In one example, file system data 224 can include data for a new file and the new file can include file data and file metadata. The file data can include the content of the file (e.g., image content, audio content) and the file metadata can include one or more attributes of the content (e.g., identifier corresponding to a zone z, stream s, and/or application a).

The object data and object metadata (e.g., attributes, tree nodes) can be stored together in the same data structure at the same storage location or can be stored separately in different data structures at different storage locations. For example, file system 124 can store the object metadata in an index node (e.g., inode) data structure and the index node data structure can have one or more pointers to the object data. The inode can be a data structure in a Unix-style file system that describes a file system object. Each inode can indicate the attributes and storage locations (e.g., block addresses) of the data of the file system object. A directory can be represented as an inode and can contain an entry for itself, its parent (e.g., parent directory), and each of its children (e.g., child directories or files). File system 124 can store file system data 224 as one or more storage units 226.

Storage unit 226 can be a contiguous or non-contiguous portion of file system data that is to be stored in a memory device. The storage units can be referred to as file system storage units and can have any size (e.g., 4 KB, 128 KB, 16 MB, 128 MB, 1 GB) and the size can or cannot be based on (e.g. a multiple of) the size of one or more memory storage units (e.g., cells, blocks, pages, zones, dies, devices, or sub-systems). File system 124 can use a fixed size (e.g., constant size or static size) for the storage units in which all of the storage units can be the same size or can use a variable size (e.g., adjustable size, dynamic size) in which the storage units used by file system 124 can have different sizes. The size of the storage unit can be determined (e.g., selected or detected) by file system 124, host system 120, memory sub-system 110, memory device 130, other entity, or a combination thereof. The size of storage unit 226 can be determined by the entity before, during, or after design, development, manufacture, installation, initialization, configuration, formatting, other event, or a combination thereof. In one example, each of the storage units 226 can be the same or similar to a file system block group.

File system 124 can divide allocated space into block groups which can be variable-sized allocation regions. The allocation regions can be used to store object metadata (e.g., extent tree node, inodes) and object data (e.g., file content, extents). A block group (BG) can be understood as a contiguous portion a file system object (e.g., a series of LBAs) that is allocated to a contiguous area of a memory device and is reserved for file system data of file system 124. This contiguous area can be represented as a range of block numbers (e.g., physical addresses). Larger files can be partitioned into the block groups that are individually tracked to make allocation and management of the files feasible over a necessary series of allocation and writes to memory devices 130A-Z. The default ratio of object data to object metadata can be 1:2. They are intended to use concepts of the Orlov block allocator to allocate related file system objects together and resist fragmentation by leaving free space between groups (Ext3 block groups, however, have fixed locations computed from the size of the file system, whereas those in b-tree file system are dynamic and created as needed). Each block group can be associated with a block group identifier (e.g., block group item). Modes in the file system tree can include a reference to a corresponding block group (e.g., pointer to storage unit).

Memory sub-system 110 can include high density non-volatile memory devices where retention of data is desired when no power is supplied to the memory device. One example of non-volatile memory devices is a negative-and (NAND) memory device. Other examples of non-volatile memory devices are described above in conjunction with memory device 130 of FIG. 1. A non-volatile memory device is a package of one or more dies with sets of blocks (e.g., physical blocks) and each block can include a set of pages. A page can include a set of cells (e.g., memory cells) and each cell can be an electronic circuit that stores information. Depending on the cell type, a cell can store one or more bits of binary information and can have various logic states that correlate to the number of bits being stored. The logic states can be represented by binary values, such as "0" and "1", or combinations of such values.

Memory devices 130A-Z can be made up of bits arranged in a two-dimensional grid. Memory cells are typically joined by wordlines (conducting lines electrically connected to the cells' control gates) and programmed together as memory pages (e.g., 16 KB or 32 KB pages) in one setting (by selecting consecutive bitlines connected to the cells' source and drain electrodes). The intersection of a bitline and wordline can constitute the address of the memory cell. A block 234 can refer to a unit of the memory device (e.g., 130A) used to store data and can include a group of memory cells, a wordline group, a wordline, or individual memory cells. One or more blocks can be grouped together to form a zone of a memory device.

Each of the zones 232A-Z can be a contiguous or non-contiguous portion of a memory device (e.g., range of blocks) that is identified and managed as a single unit. Each zone can have a corresponding zone identification data that can be used to uniquely identify the zone and can include a zone identifier (zone ID), a zone descriptor, or a zone label. A zone can be a memory storage unit and can have a predefined size based on (e.g. a multiple of) a size of another memory storage unit (e.g., cell, block, page, die, device, or sub-system). Memory sub-system 110 can use a fixed size (e.g., constant size or static size) for the zones in which all of the zones can be the same size or can use a variable size (e.g., adjustable size, dynamic size) in which the zones used by memory sub-system 110 can have different sizes. The size of the zone can be determined by memory sub-system 110, memory device 130, file system 124, host system 120, other entity, or a combination thereof.

Zones 232A-Z can enable efficient management of storage space of the memory device. For example, a set of one or more zones can be designated for use by a specific application (e.g., application, process, or thread) executed by the host system or some other system with access to the memory device. Writing to the zones is generally performed sequentially. The sequential write can be performed consecutively from the top of the memory device (e.g., smaller addresses of IC die) to the bottom of the memory device (e.g., larger addresses of the IC die), which is illustrated by the patterned blocks of data already written to the illustrated zones 232A-Z. In these embodiments, the device mapping logic 228 can track block numbers (e.g., logical block addresses) of a name space.

The namespace can include the address space of one or more of the memory devices 130A-Z. A namespace is a quantity of non-volatile memory that can be formatted into blocks (e.g., logical or physical blocks). A controller for memory devices 130A-Z (e.g., controller 115 or 135) can support multiple namespaces that are referenced using namespace identification data (e.g., namespace IDs). A namespace can be associated with a namespace data structure that is created, updated, or deleted using Namespace Management and Namespace Attachment commands. The namespace data structure can indicate capabilities and settings that are specific to a particular namespace. In one example, the name data structure and the namespace can correspond to a zoned namespace.

A zoned namespace (ZNS™) can be a sequential namespace that is defined by the NVM Express' (NVMe™) Specification. A memory device that is configured with a zone namespace can be referred to as a zoned namespace memory device or a ZNS memory device and can implement the Zoned Namespace Command Set as defined by NVMe. In a zone namespace, the address space of each of the memory devices 130A-Z can be divided into one or more zones 232A-Z. When using a zone namespace, writes are performed sequentially starting from the beginning of a zone and can be performed at a larger granularity (e.g., 64 kilobytes) and the zone can be inaccessible for the duration of the write operation. Accordingly, if a read request for data stored in the same zone or a different zone is received while the write operation is ongoing, the memory sub-system will have to suspend the write operation in order to perform the read. In one example, the zoned namespace can be implemented by a controller of a solid state drive (SSD) and include zones 232A-Z, in which there can be one or more zones for each of the one or more memory devices 130A-Z.

Each of zones 232A-Z can correspond to a write pointer (WP) that identifies a location in the zone where a prior sequential write ended. The write pointer 233 can correspond to zone 232A and can point to a beginning of a block (e.g., first available block), an end of a block (e.g., last block written to), a location within a block, or other location. Write pointer 233 can be stored and accessible to the controller of memory device 130A (e.g., controller 135), a controller of memory sub-system 110 (e.g., controller 115), processing device 221 of host system 120 (e.g., in main memory 223), other device or location, or a combination thereof. The write pointer can be used to determine whether an IO write request is directed to the write pointer, and thus is sequential, or is not directed to the write pointer, and is thus non-sequential. The write pointer for each zone can be accessible to the file system 124 for purposes of storage space allocation within the memory device 130A. For example, write pointer 233 can be stored as metadata of a file system object (e.g., metadata of a file system block group) and be used for sequential writes, as discussed in more detail below.

File system 124 can include a file system API 222 that enables computer programs (e.g., applications 225) to store or retrieve data. File system API 222 can enable file system 124 to receive data from external sources, including data from applications 225 (also referred to as user data), operating system (e.g., superblocks of data, file system metadata, and the like). With access to such metadata about these various files of different data types, the file system API 222 can be able to enable file system 124 to perform organization and storage allocation.

The applications 225 can include different types of computer programs or architectures, which function differently with respect hardware and supporting software of the computing system 100. In one embodiment, applications 225 can include a log structure merge (LSM)-based architecture such as a database (e.g., Apache Cassandra™), a staged event-driven architecture (e.g., SEDA), a distributed storage and replication architecture (e.g., Dynamo by Amazon®), a data and storage engine model (e.g., Bigtable by Google®), or other such storage engines designed to process and organize structured data, including big data, for example. In some embodiments, using an LSM-based architecture as an example, the applications 225 can handle a variety of files containing data and/or metadata of different data types. Each of the applications 225 can thus generate, access, and/or manage files of one or more data types.

Figure 3:
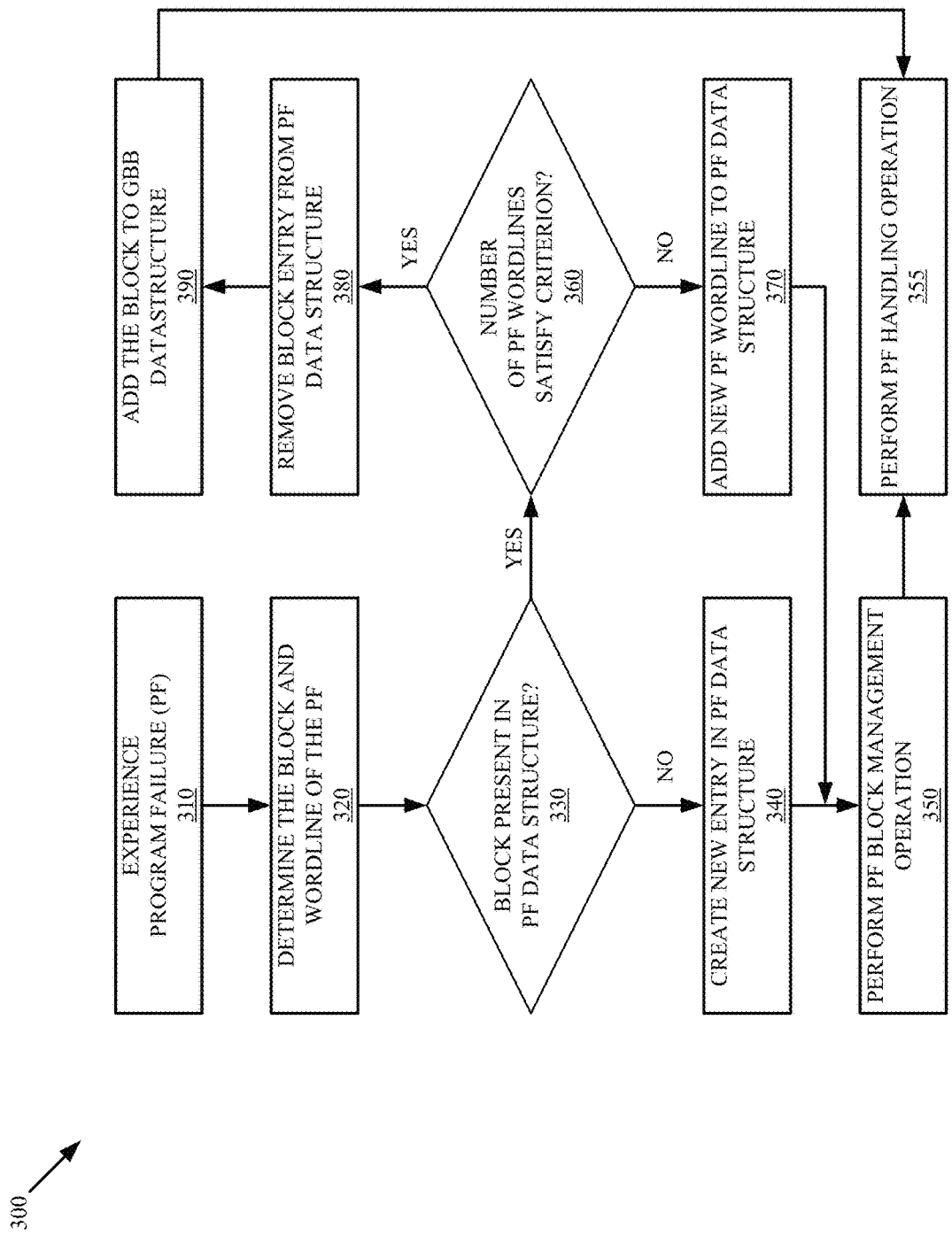
FIG. 3 is a flow chart of a method for tracking program failure affected blocks, in accordance with some embodiments of the present disclosure.

FIG. 3 is a flow chart of a method 300 for tracking program failure affected blocks, according to embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by memory sub-system 110 (e.g., via execution of block manger 113 by processor 117) of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, processing logic of a memory sub-system determines that, in response to executing a write command, a program failure occurred. For example, a host system can issue a zone append command to a memory sub-system including a memory device. The memory device can include a zone. The zone append command can be a write command (corresponding to a data block of a structured set of data) that specifies the first logical block of a zone as the write position. When executing the write command, the memory sub-system controller can write the data within the zone indicated at the current zone write pointer position, which can be repositioned to the next block in the zone in response to an executed zone append command. Responsive to executing the write command, the processing logic can determine that a program failure occurred. For example, the processing device can determine that a bit error rate (BER) exceeds a threshold criterion.

At operation 320, the processing logic determines at which wordline of which block the program failure occurred. In an embodiments, the processing device can determine the wordline by determining the write pointer position prior to or during the detected program failure.

At operation 330, the processing logic determines whether the block associated with the program failure is listed in a program failure data structure. The program failure data structure can be a metadata table, a look-up table, a database, or any other structure capable of storing a collection of data values, the relationships among them, and the functions or operations that can be applied to the data values. The program failure data structure can be maintained by block manager 113 and can include a listing of one or more wordlines that experienced a program failure, along with the corresponding block of each listed wordline. In some embodiments, the processing logic can query the program failure block data structure to determine whether the block identification (ID) number associated with the program failure is listed in the program failure data structure.

FIG. 4 shows an illustrative example of program fault data structure 410, in accordance with some embodiments of the present disclosure. Each entry in program fault data structure 410 includes a block ID number, an entry number indicating the numerical instance of the block entry in the program fault data structure, and the wordline that experienced the program fault. For example, block thirteen includes three entries in program fault data structure 410, the first entry for a program fault experienced on wordline five, the second entry for a program fault experienced on wordline 40, and the third entry for a program fault experienced on wordline 49. Block 42 includes two entries in program fault data structure 410, the first entry for a program fault experienced on wordline 22, and the second entry for a program fault experienced on wordline 30. Block two includes one entry in program fault data structure 410, an entry for a program fault experienced on wordline seven.

Returning to operation 330, responsive to determining that the block is not present in the program failure data structure, the processing logic proceeds to operation 340. Responsive to determining that the block is present in the program failure data structure, the processing logic proceeds to operation 360.

At operation 340, the processing logic generate a new entry in the program fault data structure. The entry can include the block ID number associated with the wordline that experienced the program fault, the instance of the block being listed in the program fault data structure, and the wordline (via a wordline ID) that experienced the program fault. By adding the wordline to the program fault data structure, the memory cells associated with the wordline will no longer be available for write operations. This will be explained in greater detail in FIG. 8.

At operation 350, the processing logic performs a block management operation. The block management operation can include releasing a spare wordline to the block. In particular, each block can include a predetermined number of spare wordline that are restricted from write operations (e.g., not available in the list of available physical locations that are maintained in the free pool stored in local memory 119). The spare wordlines for each block can be listed in a spare wordline data structure generated during a calibration process performed on the memory device. The spare wordline data structure can be a metadata table, a look-up table, a database, or any other structure capable of storing a collection of data values, the relationships among them, and the functions or operations that can be applied to the data values. The spare wordline data structure may include a listing of ID numbers for one or more blocks, and their associated spare wordlines. The spare wordline data structure can be maintained by the block manager 113 and used to list available spare wordlines for each available block (e.g., blocks that are enabled to perform data access operations, such as write operations, read operations, etc.). The processing logic can add the spare wordline to the list of available physical location maintained in the free pool stored in local memory 119, and then remove the corresponding wordline entry from the spare wordline data structure. Accordingly, the physical capacity of the block remains unchanged.

Figures 5, 6:
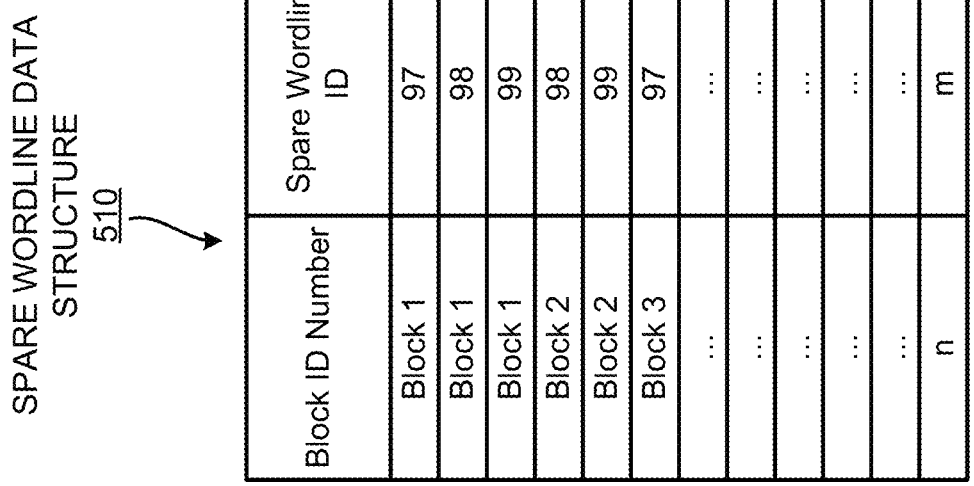
FIG. 5 is an illustrative example of a spare wordline data structure, in accordance with some embodiments of the present disclosure.
FIG. 6 is an illustrative example of a grown bad block data structure, in accordance with some embodiments of the present disclosure.

FIG. 5 shows an illustrative example of spare wordline data structure 510, in accordance with some embodiments of the present disclosure. Each entry in spare wordline data structure 510 includes a block ID number and the ID number of the spare wordlines for said block. By way of illustrative example, each block can include 100 wordlines numbered 0-99. As shown, block one includes three entries in spare wordline data structure 510; spare wordline 97, 98, and 99. Block two includes two remaining entries in spare wordline data structure 510; spare wordline 98 and 99 (spare wordline 97 was used to replace wordline 7, as seen in FIG. 4).

At operation 355, the processing logic performs a program fault error handling operation. The program fault error handling operation can update the write pointer position to select a new wordline to program the host data. The new wordline can be the next wordline in the block, a wordline in an adjacent block or plane, etc. In some embodiments, the new wordline can be associated with the same zone as the wordline that experienced the program fault. The processing logic can then perform a write operation on the new wordline to program the host data.

At operation 360 (performed responsive to determining that the block is present in the program failure data structure), the processing logic determines whether the number of wordlines (associated with the block) listed in the program fault data structure satisfy a threshold criterion. In some embodiments, the threshold criterion can include a limit value. For example, the processing logic can determine whether the number of wordlines listed for the block exceed a threshold value of three (e.g., there are three or more listed wordlines for the block). Responsive to determining that the number of wordlines listed in the program fault data structure do not exceed the threshold criterion, the processing logic proceeds to operation 370. At operation 370, the processing logic generate a new entry in the program fault data structure. The entry can include the block ID number associated with the wordline that experienced the program fault, the instance of the block being listed in the program fault data structure, and the wordline of said block that experienced the program fault.

Responsive to determining that the number of wordlines listed in the program fault data structure exceed the threshold criterion, the processing logic proceeds to operation 380. At operation 380, the processing logic removes all entries associated with the block from the program fault data structure. For example, the processing logic can identify each entry that lists the specific block ID number, and removes said entries.

At operation 390, the processing logic can mark the identified block in a GBB data structure (e.g., record the identifier (ID) of the block in the GBB data structure). The GBB data structure can be a metadata table, a look-up table, a database, or any other structure capable of storing a collection of data values, the relationships among them, and the functions or operations that can be applied to the data values. The GBB data structure may include a listing of ID numbers for each block that has been identified as a GBB. The GBB data structure can be maintained by the block manager 113 and used to track defective blocks that are no longer available for data access operations (e.g., write operation, read operations, etc.). FIG. 6 shows an illustrative example of GBB data structure 610, in accordance with some embodiments of the present disclosure, which include a listing of block ID numbers (e.g., block 30, block 52, and block 79) which have been identified as GBBs. The processing logic can then proceed to operation 355 and perform a program fault handling operation to select a new block to program to.

FIGS. 7A-7D are illustrative diagrams showing an example block experiencing exchanging an defective wordline for a spare wordline, in accordance with some embodiments of the present disclosure. FIG. 7A-7D shows block 705, which has 18 wordlines. FIG. 7A shows block 705 having 15 available wordlines (wordlines 710), and three spare wordlines (wordlines 720). FIG. 7A shows block 705 having 15 available wordlines, and three spare wordlines (wordline N, wordline N−1, and wordline N−2). FIG. 7B shows block 705 experiencing a program failure at wordline X. As such, wordline X is listed in the program failure data structure and no longer available, while spare wordline N−2 is made available to replace wordline X. FIG. 7C shows block 705 experiencing a program failure at wordline Y. As such, wordline Y is listed in the program failure data structure and no longer available, while spare wordline N−1 is made available to replace wordline Y. FIG. 7D shows block 705 experiencing a program failure at wordline Z. As such, wordline Z is listed in the program failure data structure and no longer available, while spare wordline N−2 is made available to replace wordline Z. Accordingly, block 705 include no additional spare wordline. As such, responsive to another wordline failure in block 705, block 705 can be added listed as a GBB and made unavailable for programing data onto its memory cells.

Figure 8:
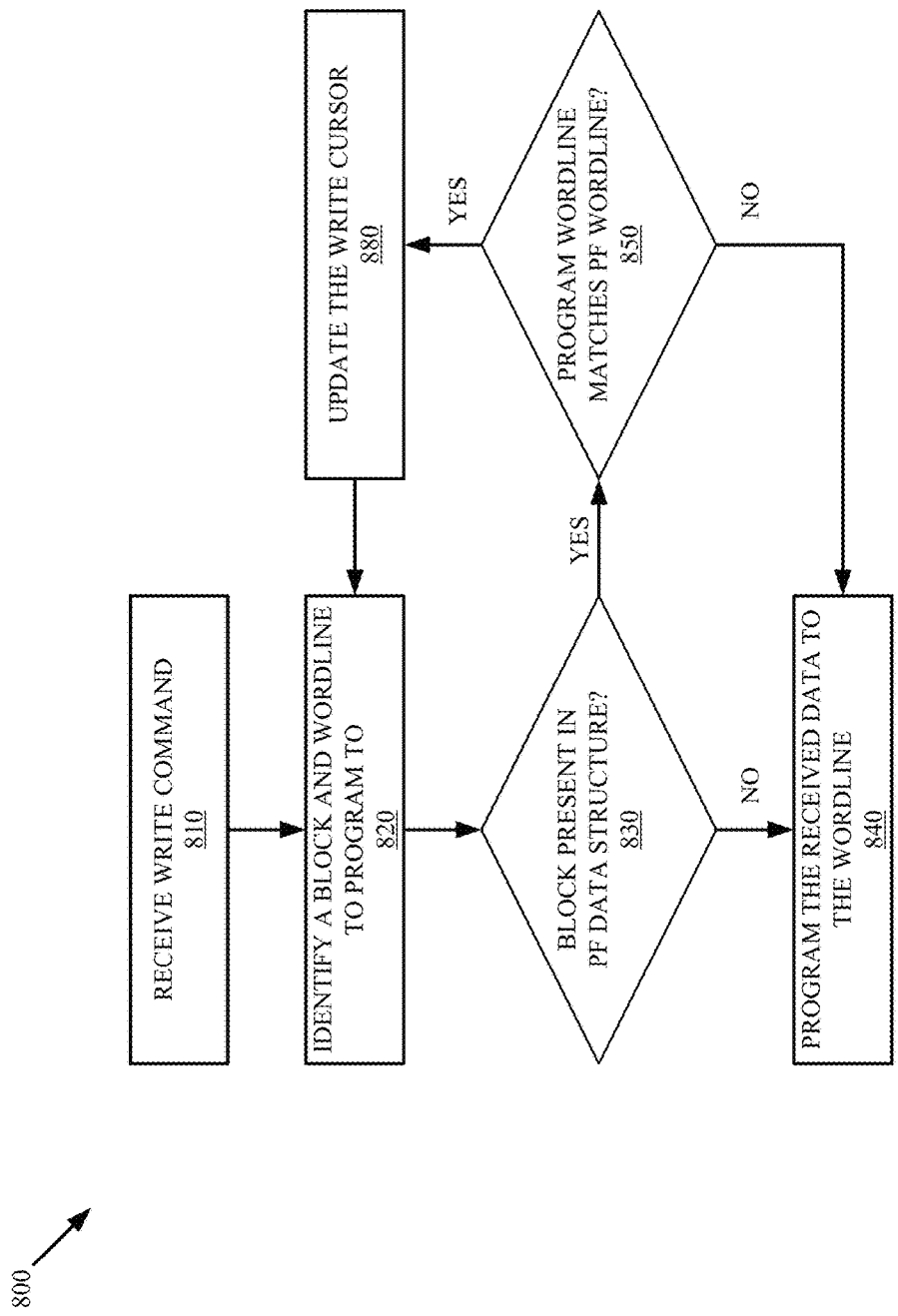
FIG. 8 is a flow chart of a method for performing a program operation, in accordance with some embodiments of the present disclosure.

FIG. 8 is a flow chart of a method 800 for performing a program operation, according to embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by memory sub-system 110 (e.g., via execution of block manager 113 by processor 117) of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing logic receives a write command to program host data. For example, a host system can issue a zone append command to a memory sub-system including a memory device. The memory device can include a zone. The zone append command can be a write command (corresponding to a data block of a structured set of data) that specifies the first logical block of a zone as the write position.

At operation 820, the processing logic identifies a wordline of a block that addresses a set of memory cells (e.g., a page) onto which to program the data. In some embodiments, the block and wordline can be identified by a current position of a write pointer.

At operation 830, the processing logic determines whether the identified block is present in the program fault data structure. For example, the processing logic can query the program fault data structure to determine whether any of the entries include the identification number of the identified block. Responsive to determining that the identified block is not present in the program fault data structure, the processing logic proceeds to operation 840. At operation 840, the processing logic programs the received data to the identified set of memory cells. For example, the data may be retrieved from a memory device or a cache and programmed onto the memory cells. To program the data, the processing logic can apply a certain voltage to each memory cell, which results in an electric charge being held by each memory cell, thus determining a voltage signal $V_{CG}$ that has to be applied to a control electrode of the cell to open the cell to the flow of electric current across the cell, between a source electrode and a drain electrode.

Responsive to determining that the identified block is present in the program fault data structure, the processing logic proceeds to operation 850. At operation 850, the processing logic determines whether the identified wordline matches an entry in the program fault data structure. For example, the processing logic can query entries containing the block ID in the program fault data structure to determine whether any of the entries include identification number of the wordline. Responsive to determining that the identified wordline is not present in the program fault data structure, the processing logic proceeds to operation 840, where the processing logic programs the received data to the identified set of memory cells.

Responsive to determining that the identified wordline is present in the program fault data structure, the processing logic proceeds to operation 880. At operation 880, the processing logic updates the location of (e.g., select a new location for) the write cursor. The new wordline can be the next wordline in the block, a wordline in an adjacent block or plane, etc. In some embodiments, the new wordline can be associated with the same zone as the wordline that experienced the program fault. The processing logic can then proceed to operation 820.

Figure 9:
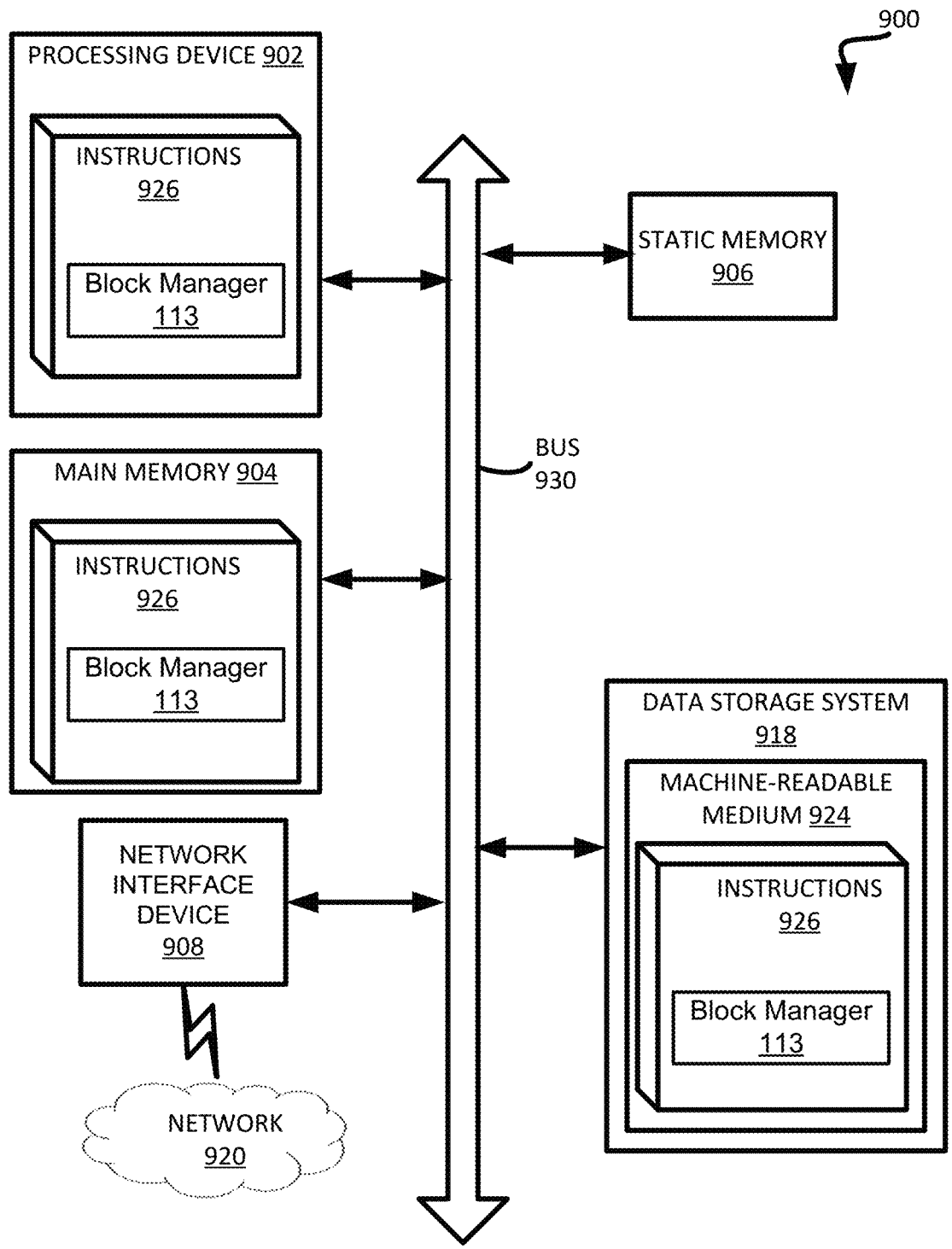
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIGS. 1-2) that includes, is coupled to, or utilizes a memory sub-system (e.g., memory sub-system 110 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a non-transitory computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to the block manager 113 of FIG. 1. While the machine-readable storage medium 924 is shown in an example embodiment to be a single medium, the term "non-transitory machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., non-transitory computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
identifying, using a write pointer, a block of a plurality of blocks of a memory device;
performing a write operation to program data to a set of memory cells addressable by a first wordline of a plurality of wordlines associated with the block;
determining that a program fault occurred during the write operation;
determining a number of wordlines referenced by a program fault data structure that are associated with the block;
responsive to determining that the number of wordlines fails to satisfy a threshold criterion, releasing a second wordline of the plurality of wordlines to be available for write operations;
appending the second wordline to a set of wordlines associated with the block that are available for write operations; and
udating the write pointer to select, among the set of wordlines that are available for write operations, a new wordline associated with the block.

2. The method of claim 1, further comprising:
responsive to determining that the number of wordlines satisfies the threshold criterion, marking the block in a grown bad block (GBB) data structure.

3. The method of claim 1, further comprising:
determining whether the block is listed in the program fault data structure; and
responsive to determining that the block is not listed in the program failure data structure, performing the write operation on a third wordline of the plurality of wordlines.

4. The method of claim 1, further comprising:
responsive to determining that the number of wordlines fails to satisfy the threshold criterion, listing the first wordline the program fault data structure.

5. The method of claim 1, further comprising:
receiving, by a processor, a write command;
identifying a third wordline of the block that addresses different set of memory cells onto which to program the data; and
responsive to determining that the third wordline is listed in the program fault data structure, identifying a different wordline onto which to program the data.

6. The method of claim 1, further comprising:
responsive to determining that the number of wordlines satisfies the threshold criterion, removing all entries associated with the block from the program fault data structure.

7. The method of claim 1, further comprising:
maintaining a spare wordline data structure, wherein each entry in the spare wordline data structure is associated with an inactive wordline capable of replacing a defective wordline in the block.

8. A system comprising:
a memory device; and
a processing device, operatively coupled with the memory device, to perform operations comprising:
identifying, using a writer pointer, a block of a plurality of blocks of a memory device
performing a write operation to program data to a set of memory cells addressable by a first wordline of a plurality of wordlines associated with the block;
determining that a program fault occurred during the write operation;
determining a number of wordlines referenced by a program fault data structure that are associated with the block;
responsive to determining that the number of wordlines fails to satisfy a threshold criterion, selecting a second wordline of the plurality of wordlines that are unavailable for write operations;

appending the second wordline to a set of wordlines that are available for write operations; and updating the write pointer to select, among the set of wordlines that are available for write operations, a new wordline associated with the block.

9. The system of claim 8, wherein the processing device is to further perform operations comprising:

responsive to determining that the number of wordlines satisfies the threshold criterion, marking the block in a grown bad block (GBB) data structure.

10. The system of claim 8, wherein the processing device is to further perform operations comprising:

determining whether the block is listed in the program fault data structure; and responsive to determining that the block is not listed in the program failure data structure, performing the write operation on a third wordline of the plurality of wordlines.

11. The system of claim 8, wherein the processing device is to further perform operations comprising:

responsive to determining that the number of wordlines fails to satisfy the threshold criterion, listing the first wordline the program fault data structure.

12. The system of claim 8, wherein the processing device is to further perform operations comprising:

receiving a write command;

identifying a third wordline of the block that addresses different set of memory cells onto which to program the data; and responsive to determining that the third wordline is listed in the program fault data structure, identifying a different wordline onto which to program the data.

13. The system of claim 8, wherein the processing device is to further perform operations comprising:

responsive to determining that the number of wordlines satisfies the threshold criterion, removing all entries associated with the block from the program fault data structure.

14. The system of claim 8, wherein the processing device is to further perform operations comprising:

maintaining a spare wordline data structure, wherein each entry in the spare wordline data structure is associated with an inactive wordline capable of replacing a defective wordline in the block.

15. A non-transitory computer-readable medium storing instructions, which when executed by a processing device, cause the processing device to perform operations comprising:

identifying, using a write pointer, a block of a plurality of blocks of a memory device;

performing a write operation to program data to a set of memory cells addressable by a first wordline of a plurality of wordlines associated with the block;

determining that a program fault occurred during the write operation;

determining a number of wordlines referenced by a program fault data structure that are associated with the block;

responsive to determining that the number of wordlines fails to satisfy a threshold criterion, selecting a second wordline of the plurality of wordlines that are unavailable for write operations;

appending the second wordline to a set of wordlines that are available for write operations; and updating the write pointer to select, among the set of wordlines that are available for write operations, a new wordline associated with the block.

16. The non-transitory computer-readable medium of claim 15, wherein the processing device is to further perform operations comprising:

responsive to determining that the number of wordlines satisfies the threshold criterion, marking the block in a grown bad block (GBB) data structure.

17. The non-transitory computer-readable medium of claim 15, wherein the processing device is to further perform operations comprising:

determining whether the block is listed in the program fault data structure; and responsive to determining that the block is not listed in the program fault data structure, performing the write operation on a third wordline of the plurality of wordlines.

18. The non-transitory computer-readable medium of claim 15, wherein the processing device is to further perform operations comprising:

responsive to determining that the number of wordlines fails to satisfy the threshold criterion, listing the first wordline the program fault data structure.

19. The non-transitory computer-readable medium of claim 15, wherein the processing device is to further perform operations comprising:

receiving a write command;

identifying a third wordline of the block that addresses different set of memory cells onto which to program the data; and responsive to determining that the third wordline is listed in the program fault data structure, identifying a different wordline onto which to program the data.

20. The non-transitory computer-readable medium of claim 15, wherein the processing device is to further perform operations comprising:

responsive to determining that the number of wordlines satisfies the threshold criterion, removing all entries associated with the block from the program fault data structure.

* * * * *